United States Patent
Yang et al.

(10) Patent No.: US 6,900,546 B2
(45) Date of Patent: May 31, 2005

(54) SEMICONDUCTOR MEMORY DEVICE AND METHOD FOR MANUFACTURING THE SAME

(75) Inventors: Won-Suk Yang, Kyungki-do (KR); Sang-Hoo Song, Seoul (KR); Ki-Nam Kim, Kyungki-do (KR); Hong-Sik Jeong, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/091,102

(22) Filed: Mar. 4, 2002

(65) Prior Publication Data

US 2002/0123193 A1 Sep. 5, 2002

(30) Foreign Application Priority Data

Mar. 5, 2001 (KR) .......................................... 2001-11156

(51) Int. Cl.[7] .......................... H01L 23/48; H01L 23/52; H01L 29/40
(52) U.S. Cl. ........................ 257/775; 257/306; 257/774; 257/760
(58) Field of Search ................................ 257/774–775, 257/303–311, 756, 758, 760; 438/253–256, 258, 241, 396–399, 618, 622, 624, 638, 640

(56) References Cited

U.S. PATENT DOCUMENTS

| | | | | |
|---|---|---|---|---|
| 5,519,237 A | * | 5/1996 | Itoh et al. .................... | 257/306 |
| 5,693,971 A | * | 12/1997 | Gonzalez ..................... | 257/314 |
| 6,291,335 B1 | * | 9/2001 | Schnabel et al. ........... | 438/626 |
| 6,365,453 B1 | * | 4/2002 | Deboer et al. .............. | 438/253 |
| 6,407,464 B1 | * | 6/2002 | Terauchi ..................... | 257/296 |
| 6,451,651 B1 | * | 9/2002 | Park et al. .................. | 438/253 |
| 2001/0005624 A1 | * | 6/2001 | Aoyagi et al. .............. | 438/622 |
| 2001/0034106 A1 | * | 10/2001 | Moise et al. ................ | 438/396 |

OTHER PUBLICATIONS

Wolf et al. Silicon Processing for the VLSI Era, vol. 3– The Submicron MOSFET, Lattice Press, 1995, pp. 288–289.*

* cited by examiner

*Primary Examiner*—Jennifer M. Kennedy
(74) *Attorney, Agent, or Firm*—Marger Johnson & McCollom, P.C.

(57) ABSTRACT

A conductive portion connects a lower conductive layer formed on a semiconductor substrate provided in a first interlayer insulating layer to an upper conductive layer formed on the lower conductive layer, and provided in a second interlayer insulating layer. This portion is divided into at least one plug and a pad. At least one plug is formed in a first interlayer insulating layer and the lower part of a second interlayer insulating layer. The second interlayer insulating layer is divided into a plurality of interlayer insulating layers so that upper and lower widths of the divided plugs formed in the divided portion of the second interlayer insulating layer are not greatly different from each other. The pad formed on the upper portion of the second interlayer insulating layer has an upper width such that the upper conductive layer connected to the pad is not undesirably connected to an adjacent upper conductive layer via the pad.

9 Claims, 14 Drawing Sheets

SEMICONDUCTOR MEMORY DEVICE AND METHOD FOR MANUFACTURING THE SAME

BACKGROUND OF THE INVENTION

1. Field of the Invention

The present invention relates to a semiconductor device and a method for manufacturing the same and, more particularly, to a semiconductor device with a pad structure formed within an interlayer insulating layer to prevent a short circuit between conductive lines on the interlayer insulating layer and a method for manufacturing the same.

2. Description of the Related Art

A lower conductive layer of a semiconductor memory device is connected to an active area of a semiconductor substrate via plugs provided in an interlayer insulating layer interposed between the lower conductive layer and the semiconductor substrate and is connected to an upper conductive layer via plugs provided in an interlayer insulating layer formed on the lower conductive layer. In a case where bit lines make up the lower conductive layer, a metal interconnection layer is used as the upper conductive layer corresponding to the lower conductive layer. In a case where local bit lines are accommodated in the lower conductive layer, global bit lines are used as the upper conductive layer.

As the integration density of semiconductor devices increases, various methods of increasing the capacitance of capacitors, which are devices that store electric charges, have been studied. Among these methods is a method of increasing the height of capacitors in order to enlarge the area of the capacitors. Thus, semiconductor devices have adopted capacitor over bit line (COB) structures so that capacitors are formed on lower conductive layers. The thicknesses of interlayer insulating layers interposed between lower and upper conductive layers have been increased. In other words, interlayer insulating layers between lower and conductive upper layers have become much thicker than interlayer insulating layers between lower conductive layers and semiconductor substrates. Consequently, the process for forming contact holes for plugs connecting lower conductive layers and semiconductor substrates is simple whereas the process for forming contact holes for plugs connecting lower and upper conductive layers is difficult. Also, since interlayer insulating layers interposed between lower and upper conductive layers are thick, contact holes in the interlayer insulating layers are small near lower conductive layers or semiconductor substrates but become larger during the process of forming contact holes.

However, if the contact holes become larger than the pitch of the upper conductive layers (as the upper width of the contact holes becomes greater), the upper conductive layers are short-circuited to adjacent upper conductive layers via plugs.

In semiconductor memory devices having bit lines of a hierarchical structure, the pitch of global bit lines can be increased in order to solve the short-circuiting problem in upper conductive layers. However, if the pitch of the global bit lines is increased, it is difficult to achieve needed high integration density in semiconductor memory devices.

SUMMARY OF THE INVENTION

To solve the above problems, it is an object of the present invention to provide a semiconductor memory device that can prevent a short circuit between upper conductive layers adjacent to each other without increasing the pitch of the upper conductive layers.

It is another object of the present invention to provide a semiconductor memory device having bit lines of a hierarchical structure which can prevent a short circuit between global bit lines adjacent to each other without increasing the pitch of the global bit lines and a method of manufacturing the same.

Accordingly, to achieve the above first and second objects, a portion connects a lower conductive layer formed on a semiconductor substrate provided in a first interlayer insulating layer to an upper conductive layer formed on the lower conductive layer and provided in a second interlayer insulating layer. This portion is divided into at least one plug and a pad. At least one plug is formed in a first interlayer insulating layer and the lower part of a second interlayer insulating layer. The second interlayer insulating layer is divided into a plurality of interlayer insulating layers so that upper and lower widths of the divided plugs formed in the divided portion of the second interlayer insulating layer are not greatly different from each other. The pad formed in the upper portion of the second interlayer insulating layer has an upper width such that the upper conductive layer connected to the pad is not connected to an adjacent upper conductive layer via the pad. The height of the pad is approximately half the height of the at least one plug.

A local bit line of a semiconductor device having bit lines of a hierarchical structure may be the lower conductive layer, and a global bit line of the semiconductor device having bit lines of a hierarchical structure may be the upper conductive layer. Transistors formed on a semiconductor substrate, e.g., NMOS transistors, control the connection between the local bit line and the global bit line. As another example, a bit line may be used for the lower conductive layer, and a metal interconnection line may be the upper conductive layer. In general, a capacitor is disposed between the lower conductive layer and the upper conductive layer.

According to an embodiment of the present invention, a semiconductor memory device includes: a semiconductor substrate; a first interlayer insulating layer formed on the semiconductor substrate; a plurality of first conductive layers spaced apart from each other on the first interlayer insulating layer; a second interlayer insulating layer formed on the plurality of first conductive layers; a plurality of second conductive layers spaced apart from each other on the second interlayer insulating layer; and a plurality of connecting devices formed in the first and second interlayer insulating layers, the plurality of connecting devices for connecting the first and second conductive layers. The connecting devices each include at least one plug stacked from the semiconductor substrate to the lower portion of the second interlayer insulating layer and a pad formed in the upper portion of the second interlayer insulating layer for connecting at least one plug and one of the second conductive layers. The pad has an upper width such that one of the second conductive layers connected to the pad is not connected to another one of the second conductive layers via the pad. Preferably, the height of the at least one plug is greater than twice the height of the pad.

The connecting devices further comprise a second plug for directly connecting one of the first conductive layers and the semiconductor substrate, and the height of the second plugs is 30–50% of the height of the at least one plug.

According to another embodiment of the present invention, a semiconductor memory device includes: a semiconductor substrate; a first interlayer insulating layer; a plurality of local bit lines spaced apart from each other and disposed on the first interlayer insulating layer; a second interlayer insulating layer overlying the plurality of local bit lines; a capacitor formed on the second interlayer insulating layer and connected to the semiconductor substrate; a plurality of global bit lines that are spaced apart from each other and are disposed on the second interlayer insulating layer and cover the capacitor; and a plurality of connecting devices that are formed in the first and second interlayer insulating layers, and each of the connecting devices electrically connect the plurality of local bit lines and the plurality of global bit lines. Each of the connecting devices has a pad directly connected to one of global bit lines, first plugs connecting the semiconductor substrate to one of the local bit lines, a connector extending from one of the local bit lines and disposed between one of the local bit lines and the first plugs, and second plugs formed in the first and second interlayer insulating layers, connected to the pad, and connected to the first plugs via the semiconductor substrate. The second plug are wider toward the upper portion of the second interlayer insulating layer, the upper portion of the second plugs is un-connected to the upper portion of adjacent second plugs, the lower width of the pad is less than the upper width of the second plugs, and the pad has an upper width such that one of the global bit lines connected to the pad is not connected to an adjacent global bit line via the pad.

If the pitch of the global bit lines is equal to the pitch of the connector, the height of the second plug is 2–4 times the height of the pad. If the pitch of the connector is twice the pitch of the global bit lines, the height of the second plugs is four times the height of the pad. The height of the first plugs is equal to or greater than the height of the pad.

The upper surface of the second plugs is positioned higher than the upper surface of the capacitor.

According to an embodiment of the present invention, a method of manufacturing a semiconductor memory device is provided. A first interlayer insulating layer is formed on the semiconductor substrate. A plurality of first conductive layers are formed to be spaced apart from each other and disposed on the first interlayer insulating layer. A second interlayer insulating layer is formed on the plurality of first conductive layers. A plurality of second conductive layers are formed to be spaced apart from each other and disposed on the second interlayer insulating layer. A plurality of connecting devices, which are formed in the first and second interlayer insulating layers and connect the first conductive layers and the second conductive layers via the semiconductor substrate, are formed. The connecting devices includes at least one plug formed from the semiconductor substrate to the lower portion of the second interlayer insulating layers, a pad connecting the at least one plug and one of the second conductive layers, and a second plug directly connecting one of the first conductive layers and the semiconductor substrate. The pad has an upper width such that one of the second conductive layers connected to the pad is not short-circuited to an adjacent second conductive layer.

According to another embodiment of another aspect of the present invention, a method of manufacturing a semiconductor memory device is provided. A connection control transistor is formed on the semiconductor substrate when a cell transistor is formed in a cell array area. First and second plugs, each of which is connected to source and drain areas of the connection control transistor, are formed on the entire surface of the semiconductor substrate on which the connection control transistor is formed. A connector connected to the first plugs and a local bit line connected to the connector are formed on the first interlayer insulating layer. A third interlayer insulating layer having a third plug connected to the second plug is formed on the second interlayer insulating layer. A capacitor, which is insulated from the local bit line and connected to source and drain areas of the cell transistor, is formed between the steps of forming the local bit line and the third plugs. The upper surface of the third plugs is positioned higher than the upper surface of the capacitor. A predetermined upper portion of the third interlayer insulating layer is etched to form a pad connected to the third plug formed in the lower portion of the third interlayer insulating layer. A global bit line is formed on the third interlayer insulating layer having the pad. The upper portion of the third plugs is not connected to the upper portion of an adjacent third plugs, the lower width of the third pad is less than the upper width of the third plug, and the pad has an upper width such that the global bit line connected to the pad is not short-circuited to an adjacent global bit line via the pad.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Hereinafter, preferred embodiments of the present invention will be described in detail with reference to the attached drawings. The description of the preferred embodiments will be restricted to a semiconductor memory device where global bit lines are used as upper conductive layers and local bit lines are used as lower conductive layers. However, this is only an illustration for explaining the spirit of the present invention, and the scope of the present invention must not be interpreted as being restricted to the embodiments.

Figure 1:
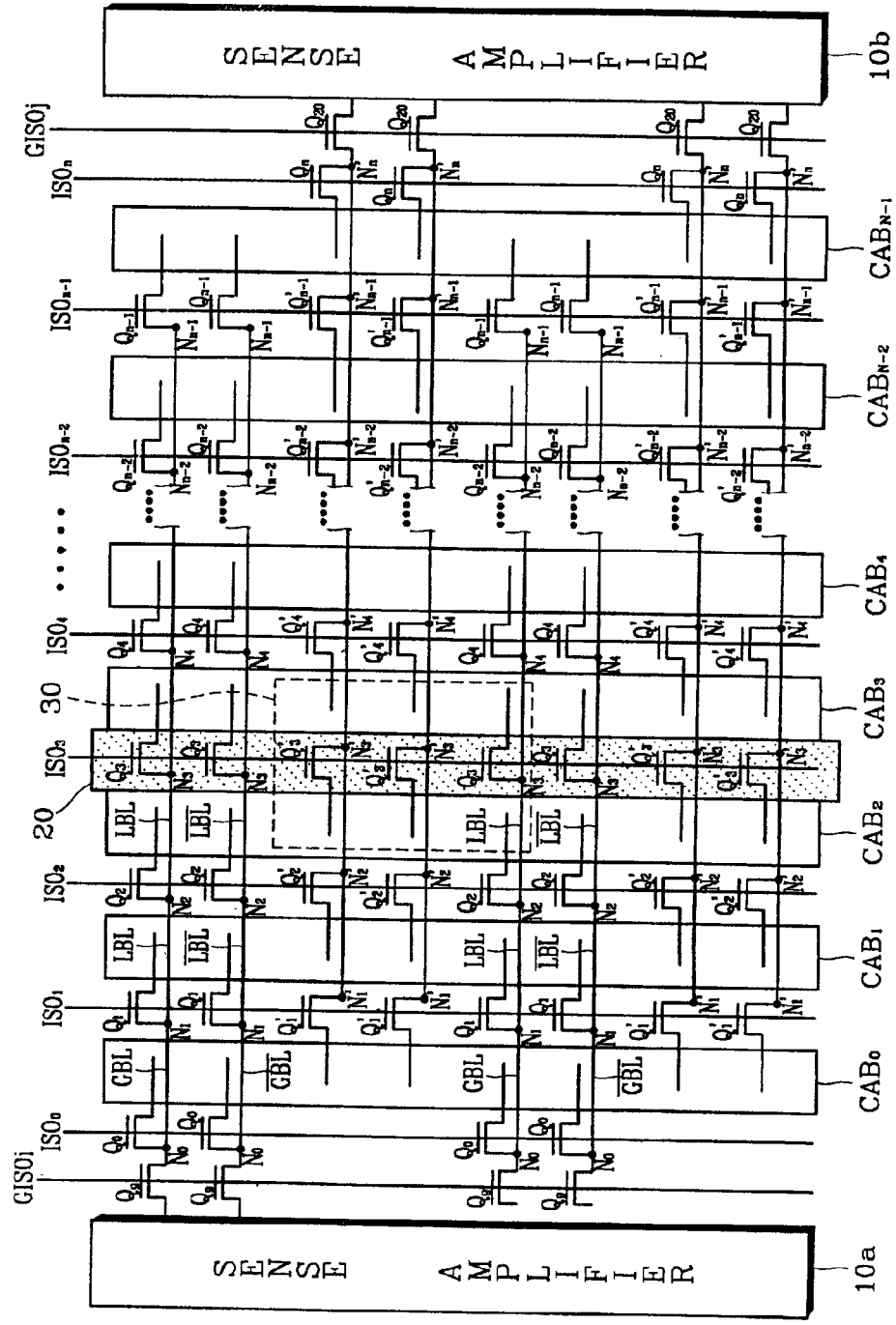
FIG. 1 is a schematic circuit diagram of a semiconductor memory device having bit lines of a hierarchical structure according a first embodiment of the present invention.

FIG. 1 is a schematic circuit diagram showing the transmission of data from cell array blocks $CAB_0$, $CAB_1$, $CAB_2$, ..., $CAB_{n-2}$, and $CAB_{n-1}$ to sense amplifiers $10a$ and $10b$ via array select transistors $Q_9$ and $Q_{20}$ in a semiconductor memory device having bit lines of a hierarchical structure. Referring to FIG. 1, the semiconductor memory device includes a plurality of memory cell array blocks $CAB_0$, $CAB_1$, $CAB_2$, ..., $CAB_{n-2}$, and $CAB_{n-1}$ each including a plurality of DRAM unit cells (not shown), a plurality of word lines (not shown), and a plurality of local bit lines LBLs. The DRAM unit cells each have one transistor (not shown) and one capacitor (not shown). Word lines are connected to gates (not shown) of transistors, capacitors are connected to source areas, and ends of local bit lines LBLs are connected to drain areas. The other ends of the local bit lines LBLs are connected to sources of connection control transistors $Q_0$, $Q_0'$; $Q_1$, $Q_1'$; $Q_2$, $Q_2'$; ... ; $Q_{n-1}$, $Q_{n-1}'$; $Q_n$, $Q_n'$ in an isolation area 20. The connection control transistors may be NMOS transistors.

A plurality of global bit lines GBLs are connected to the connection control transistors $Q_0$, $Q_0'$; $Q_1$, $Q_1'$; $Q_2$, $Q_2'$; ... ; $Q_{n-1}$, $Q_{n-1}'$; $Q_n$, $Q_n'$ in the isolation area 20 via nodes $N_0$, $N_0'$; $N_1$, $N_1'$; ... ; $N_{n-1}$, $N_{n-1}'$; $N_n$; $N_n'$. Gates of each of the connection control transistors $Q_0$, $Q_0'$; $Q_1$, $Q_1'$; $Q_2$, $Q_2'$; ... ; $Q_{n-1}$, $Q_{n-1}'$; $Q_n$, $Q_n'$ in the isolation area 20 are commonly connected to select signal lines $ISO_0$, $ISO_1$, $ISO_2$, ..., $ISO_{n-2}$, and $ISO_{n-1}$. If a predetermined select signal line is loaded with logic "high", the connection control transistors connected to the select signal line are all turned on. Cell data of cell array blocks connected to the connection control transistors that turned on are transmitted to the sense amplifiers 10a and 10b via the local bit lines LBLs in a corresponding cell array block and the global bit lines GBLs connected via the connection control transistors that are turned on. A transistor $Q_9$ or $Q_{20}$ is turned on according to selection of a signal line GLSIOi or GLSIOj. Data from memory cell array blocks selected are transmitted to the sense amplifier 10a or 10b and then amplified.

Figure 2:
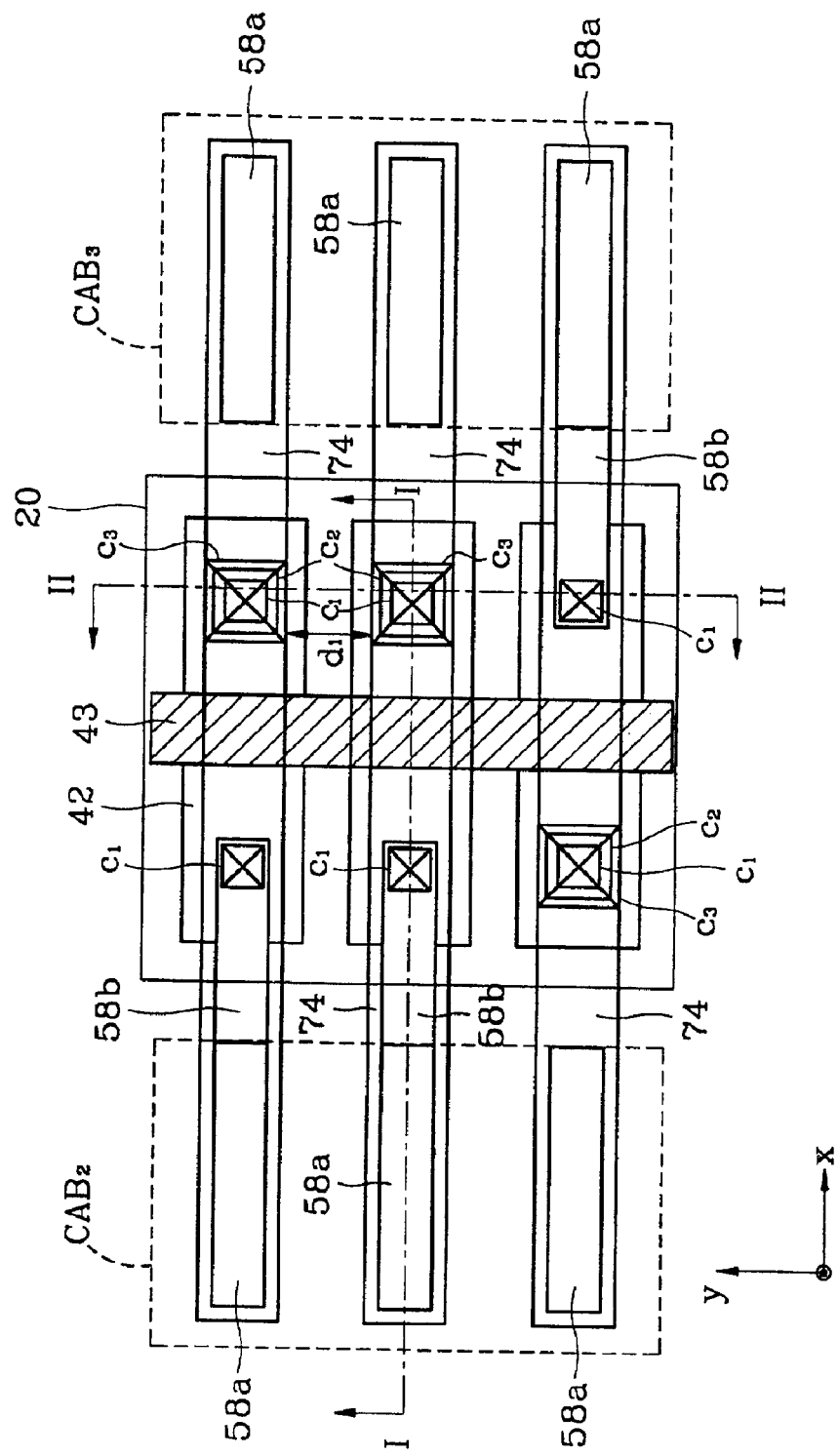
FIG. 2 is a diagram of the layout of the semiconductor memory device shown in FIG. 1.
Figure 3A:
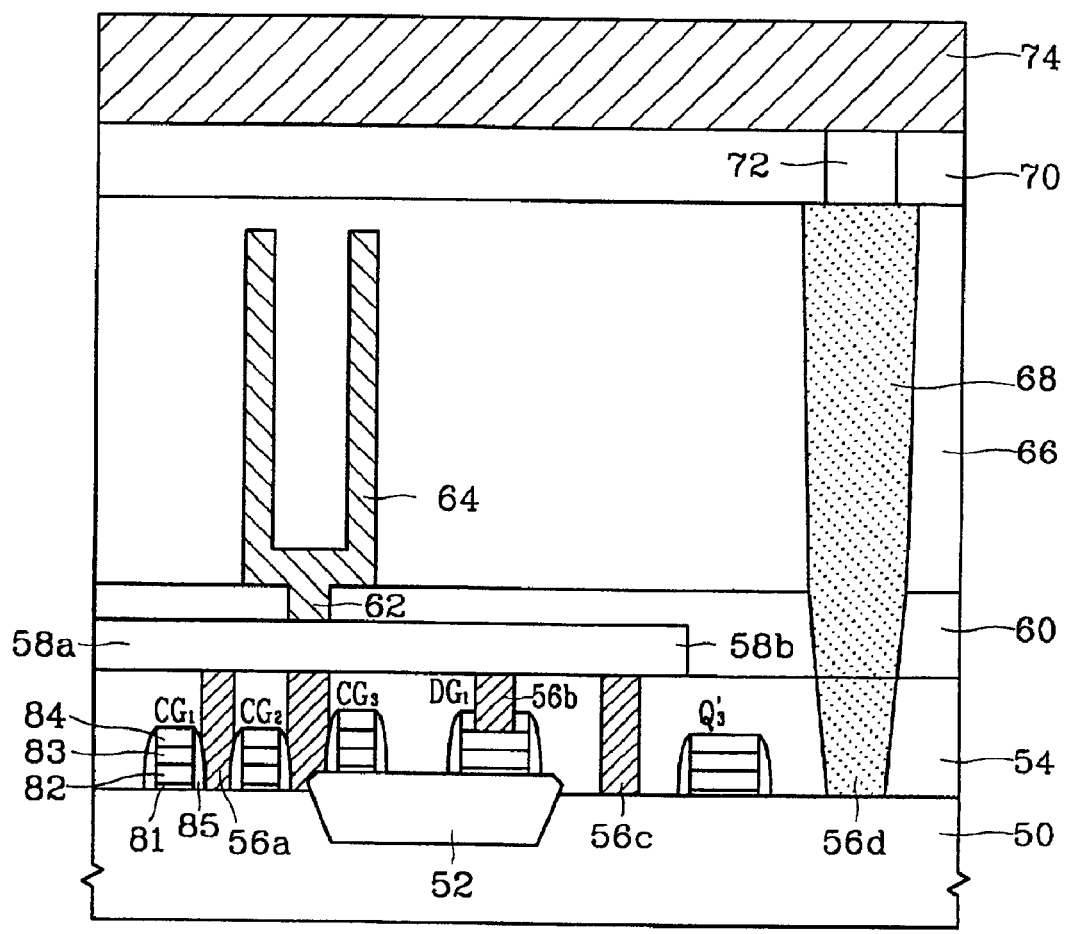
FIG. 3A is a cross-section taken along line I—I of the semiconductor memory device shown in FIG. 2.
Figure 3B:
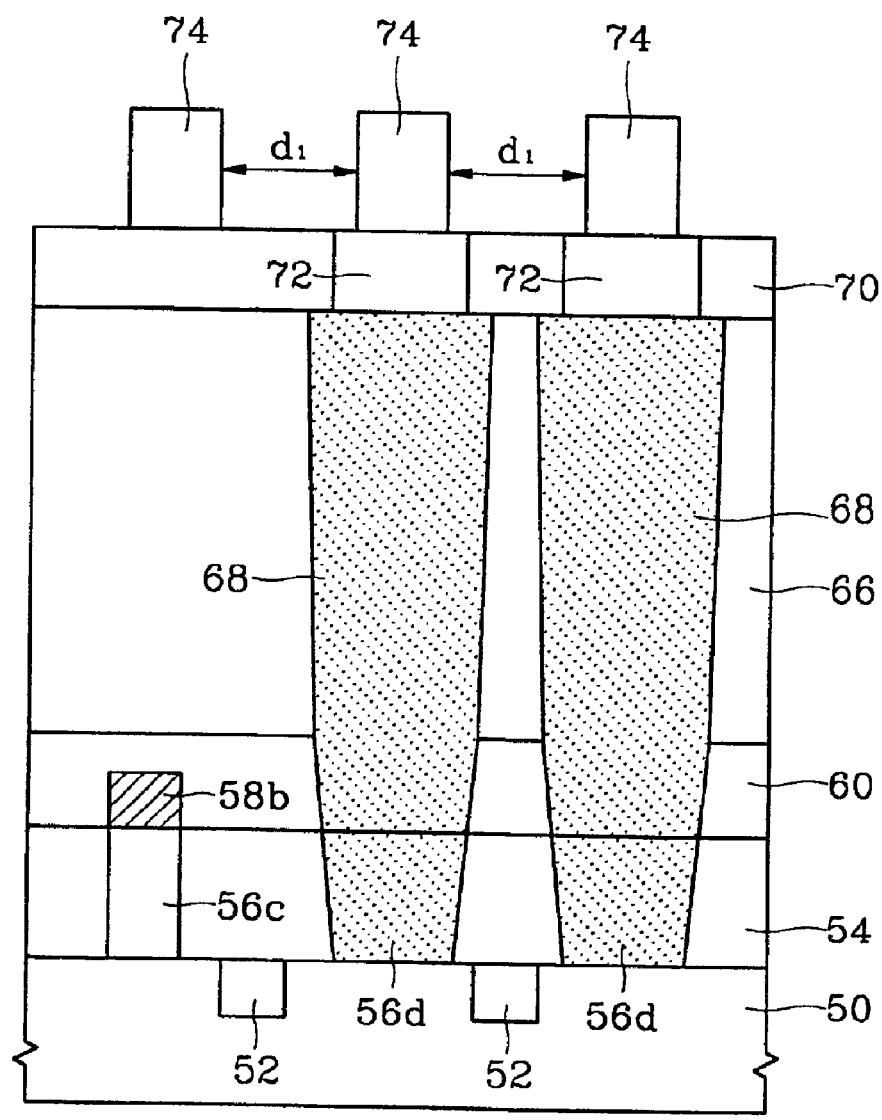
FIG. 3B is a cross-section taken along line II—II of the semiconductor memory device shown in FIG. 2.

FIG. 2 is a diagram of the layout of a portion 30 shown in FIG. 1, and FIGS. 3A and 3B are cross sections taken along lines I—I and II—II, respectively, of FIG. 2. Referring to FIG. 2, local bit lines 58a extending in the x-direction are disposed in cell array blocks $CAB_2$ and $CAB_3$. Interlayer insulating layers 60, 66, and 70 shown in FIGS. 3A and 3B are disposed between the local bit lines 58a and global bit lines 74 which extend in the x-direction. Active areas 42 and a gate electrode 43 for forming connection control transistors $Q_3'$ and $Q_3$ included in the isolation area 20 are disposed between the two cell array blocks $CAB_2$ and $CAB_3$. In FIG. 3A, the gate electrode 43 includes a gate oxide layer 81, a polysilicon layer 82 and a refractory metal silicide layer 83. A silicon nitride layer 84 formed on the refractory metal silicide layer 83 and a spacer 85 are not shown in FIG. 2. The active areas 42 extend in the x-direction and are spaced apart from each other in the y-direction. The gate electrode 43 extends in the y-direction. The active areas 42 at one end are connected to the local bit lines 58a of the cell array blocks $CAB_2$ and $CAB_3$ via plugs 56c, shown in FIGS. 3A and 3B, filling contact holes $C_1$ and connectors 58b extended from the local bit lines 58a. Meanwhile, the other ends of the active areas 42 are connected to the global bit lines 74 via plugs 56d and 68, shown in FIGS. 3A and 3B, filling contact holes $C_1$ and $C_2$ and pads 72, shown in FIGS. 3A and 3B, filling the contact holes $C_3$.

In the isolation area 20, the global bit lines 74 each face the connectors 58b of the local bit lines 58a one-to-one. Thus, the spacing between the connectors 58b and the spacing between the global bit lines 74, (both can be represented by d1), are approximately equal to each other. However, in FIG. 2, the spacing between the global bit lines 74 is shown to be different from the spacing between the local bit lines 58a or connectors 58b for illustration.

Referring to FIGS. 3A and 3B, an isolation layer 52 for isolating the cell array block $CAB_2$ from the isolation area 20 is formed on a semiconductor substrate 50. Gate electrode structures $CG_1$, $CG_2$, and $CG_3$ of a cell transistor, each including gate oxide layers 81, polysilicon layers 82, refractory silicide layers 83, silicon nitride layers 84, and nitride spacers 85, are formed in the cell array block $CAB_2$. A dummy gate electrode structure $DG_1$ is formed on the isolation layer 52, and a connection control transistor $Q_3'$ is formed in the isolation area 20 shown in FIG. 2. A local bit line 58a is formed on a first interlayer insulating layer 54 and a connector 58b is formed at an extension of the local bit line 58a. The local bit line 58a is connected to a semiconductor substrate, more particularly, to active areas 42 of a cell transistor, via a plug 56a. The connector 58b of the local bit line 58a for connecting the local bit line 58a and the connection control transistor $Q_3'$ is connected to a source area of the connection control transistor $Q_3'$ via a plug 56c. The connector 58b is also connected to the dummy gate electrode structure DG1 via a plug 56b.

A capacitor 64 is formed in a cell array area on a second interlayer insulating layer 60 overlying the local bit line 58a. The capacitor 64 is connected to the cell transistor via a storage electrode contact plug 62 formed in the first and second interlayer insulating layers 54 and 60. A third interlayer insulating layer 66 covers the capacitor 64. A global bit line 74 on a fourth interlayer insulating layer 70 formed on the third interlayer insulating layer 66 is formed on the entire surface of the semiconductor substrate 50. The global bit line 74 is connected to a drain area of the connection control transistor $Q_3'$ via a pad 72 formed in the fourth interlayer insulating layer 70, the plug 68 in the second and third interlayer insulating layers 60 and 66, and the plug 56d in the first interlayer insulating layer 54.

The first interlayer insulating layer 54, in which the plugs 56a, 56b, 56c, and 56d are formed, is much thinner than the second and third interlayer insulating layers 60 and 66, in which the plug 68 is formed, as shown in FIG. 3A. As the integration density of semiconductor devices increases, the need for greater capacitance leads to an increase in the height of the capacitor 64. Thus, since the heights of the second and third interlayer insulating layers 60 and 66 including the capacitor 64 increase, the upper width of the plug 68 is much greater than the upper width of the plug 56d.

Conventionally, the plug 68 in the third interlayer insulating layer 66 or a plug (not shown) extending to the fourth interlayer insulating layer 70 connects the global bit line 74 to the semiconductor substrate 50. However, the upper width of the plug 68 or the plug extending to the fourth interlayer insulating layer 70 increases with an etching process of forming contact holes. Thus, the global bit line 74 connected to the plug 68 or the plug extending to the fourth interlayer insulating layer 70 can be short-circuited to an adjacent global bit line 74 via plugs. In the present invention, the pad 72 having a width less than that of the plug 68 is formed in the fourth interlayer insulating layer 70 formed on the third interlayer insulating layer 66. The pad 72 connects the global bit line 74 to the drain area of the connection control transistor $Q_3'$.

The thickness of the fourth interlayer insulating layer 70 is determined in consideration of a variety of design requirements, such as the time required to transmit a signal between the global bit line 74 and the local bit line 58a. In particular, the global bit line 74 must not be connected to another global bit line 74 via the pad 72 in the fourth interlayer insulating layer 70. Thus, the thickness of the fourth interlayer insulating layer 70 should be less than the sum of the thicknesses of the second and third interlayer insulating layers 60 and 66, preferably, about ¼–½ times. Thus, since the pitch of the connector 58b and the pitch of the local bit line 74, both represented by d1, are approximately equal to each other, the global bit line 74 may be short-circuited to an adjacent global bit line 74 with an increase in the upper width of the plug 68 in the third interlayer insulating layer 66 if the third interlayer insulating layer 60 is much thicker than the fourth interlayer insulating layer 70. Then, the global bit line 74 may be short-circuited to an adjacent global bit line 74 by the plug 68 even though the short circuit between two global bit lines 74 is not generated by the pad 72.

The height of the capacitor 64 may be determined based on the integration density of the semiconductor memory device. Thus, the thickness of the third interlayer insulating layer 66 covering the capacitor 64 is also determined on the basis of the integration density of the semiconductor memory device. In this case, the thickness of the fourth interlayer insulating layer 70 having the pad 72 is not determined based on the thickness of the third interlayer insulating layer 66. Rather, the pad 72 has a width less than the upper width of the plug 68 and has an upper width such that the global bit line 74 connected to the pad 72 is not short-circuited to an adjacent global bit line 74 via the pad 72.

The short circuit of the local bit line 58a having the same pitch as the global bit line 74 is not generated in a process of forming the plugs 56a, 56b, 56c, and 56d in the first interlayer insulating layer 54. Thus, the fourth interlayer insulating layer 70 may be formed to the same thickness as the first interlayer insulating layer 54 or less.

Figure 4A:
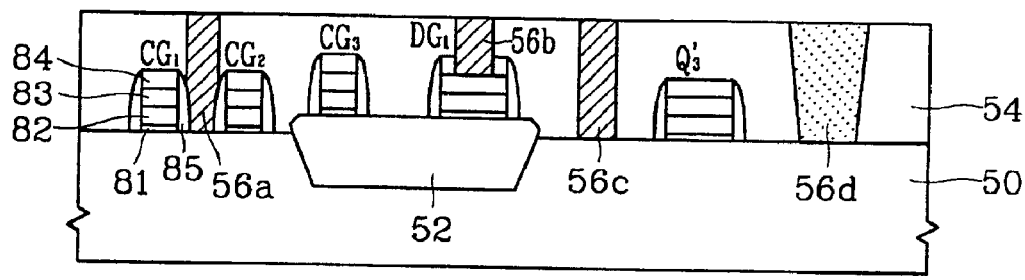
FIGS. 4A through 4C are cross-sections describing steps of manufacturing the semiconductor memory device shown in FIG. 3A.

A method for manufacturing the semiconductor device shown in FIG. 3A will be described with reference to FIGS. 4A through 4C. Referring to FIG. 4A, gate electrode structures $CG_1$, $CG_2$, and $CG_3$ for a cell transistor, a dummy gate electrode structure $DG_1$, and a gate electrode structure of the connection control transistor $Q_3'$ are formed on the semiconductor substrate 50 on which the isolation layer 52 is formed. These gate electrode structures each includes gate oxide layers 81, polysilicon layers 82, refractory metal silicide layers 83, silicon nitride layers 84, and nitride spacers 85. A first interlayer insulating layer 54 having a thickness of about 0.6 μm is formed on the entire surface of the semiconductor substrate 50. Plugs 56a, 56b, 56c, and 56d are formed by etching a predetermined portion of the first interlayer insulating layer 54, forming contact holes, and filling the contact holes with a conductive material, e.g., polysilicon. The plug 56a contacts active areas 42 of the cell transistor, and the plugs 56c and 56d contact source and drain areas of the connection control transistor $Q_3'$.

Figure 4B:
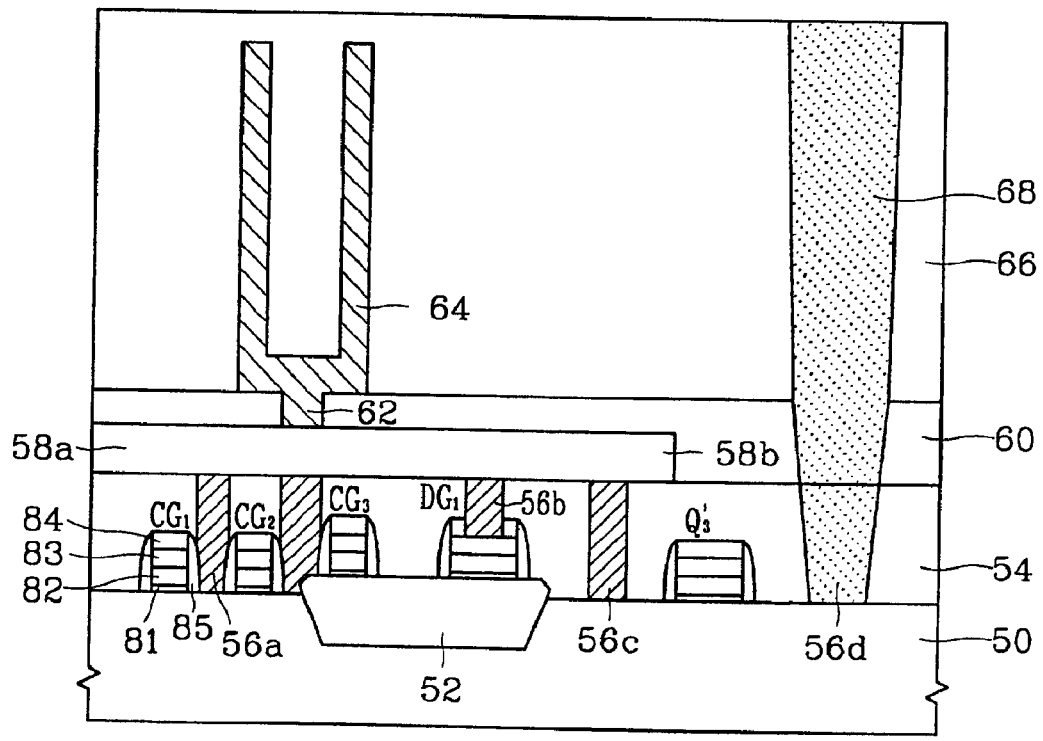

With reference to FIG. 4B, a conductive layer, i.e., the local bit line 58a and the connector 58b, is formed on the first interlayer insulating layer 54 in which the plugs 56a, 56b, 56c, and 56d are formed. A second interlayer insulating layer 60 having a thickness of about 0.5 μm is formed on the conductive layer. The second interlayer insulating layer 60 insulates the local bit line 58a from a capacitor 64 which will be formed later. A storage electrode contact plug 62 is formed by forming a contact hole in the first and second interlayer insulating layers 54 and 60 and then filling the contact hole with a conductive material, e.g., polysilicon. A capacitor 64 having a storage electrode, a capacitor dielectric layer, and a plate electrode is formed on the second interlayer insulating layer 60. A third interlayer insulating layer 66 having a thickness of about 2 μm is formed on the entire surface where the capacitor 64 is formed to fully cover the capacitor 64.

A plug 68 is formed by forming a contact hole in the second and third interlayer insulating layers 60 and 66 to expose the plug 56d in contact with the drain area of the connection control transistor $Q_3'$ and then filling the contact hole with a conductive material, such as polysilicon. The plugs 56a, 56b, 56c, and 56d in the first interlayer insulating layer 54 have about 30% of the height of the plug 68 in the second and third interlayer insulating layers 60 and 66. Reviewing the processes of forming the plug 68, a contact hole is formed by etching a predetermined portion of the second and third interlayer insulating layers 60 and 66. A polysilicon layer (not shown) is formed on the entire surface of the third interlayer insulating layer 66 and then planarized, e.g., chemical mechanical polished until the upper surface of the third interlayer insulating layer 66 is exposed. Here, a portion of the third interlayer insulating layer 66 may be etched during polishing. Thus, it is preferable that the plug 68 be higher than the capacitor 64 so than the upper surface of the capacitor 64 is not affected by polishing.

In FIG. 4B, the third interlayer insulating layer 66 having the plug 68 is preferably formed in a single process after the local bit line 58a and the capacitor 64 are formed. Alternatively, the third interlayer insulating layer 66 on the second interlayer insulating layer 60 may be formed in more than a single process. The capacitor 64 may be formed before the third interlayer insulating layer 66 is formed in several processes. In other words, only a portion of the third interlayer insulating layer 66 is formed on the second interlayer insulating layer 60, and a portion of the plug 68 is formed therein. Then, a capacitor 64 is formed on the portion of the third interlayer insulating layer 66. The rest of the third interlayer insulating layer 66 is subsequently formed, and the rest of the plug 68 is formed therein. Here, the plug 68 is formed in the third interlayer insulating layer 66 in two or more processes. Thus, an increase in the upper width of the plug 68 can be reduced.

Figure 4C:
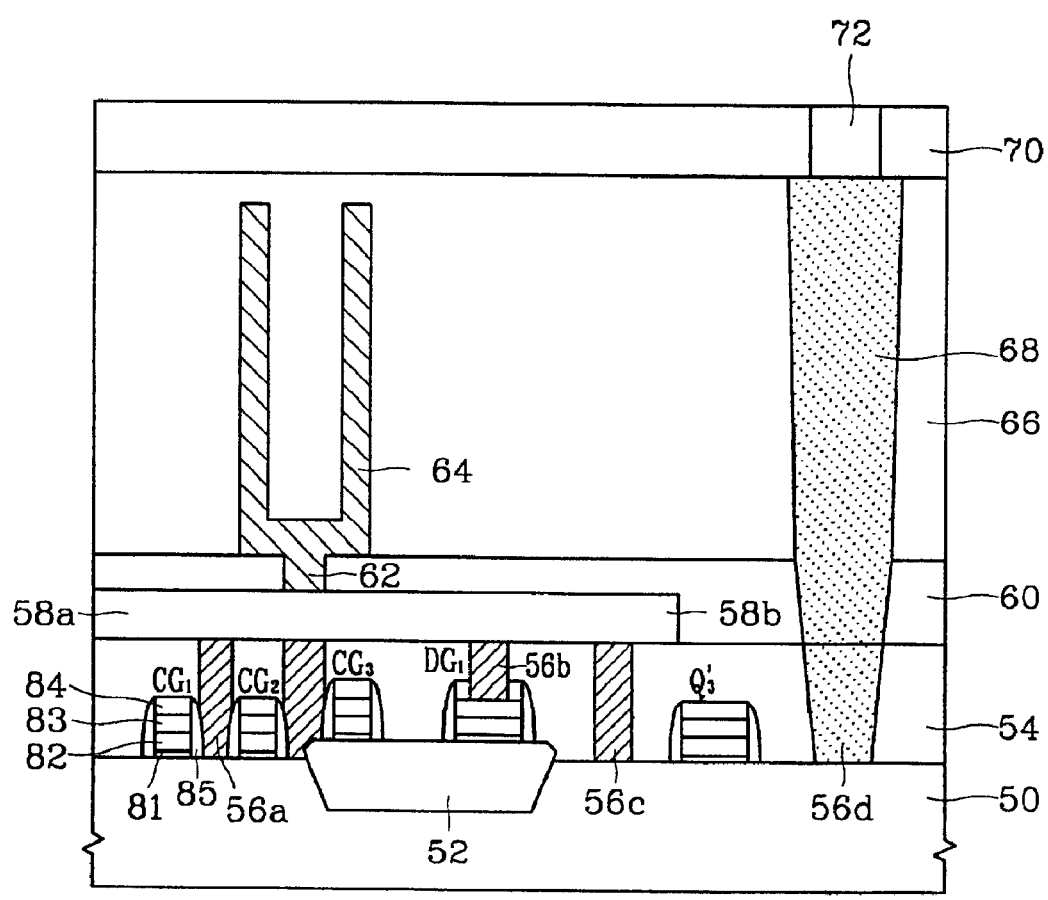

Referring to FIG. 4C, a fourth interlayer insulating layer 70 having a thickness of about 0.4 μm is formed on the third interlayer insulating layer 66 having the plug 68 formed therein. A contact hole is formed in the fourth interlayer insulating layer 70 and then filled with a conductive material to form a pad 72 that is connected to the plug 68. The pad 72 can be formed in the fourth interlayer insulating layer 70 by a damascene method. Global bit lines having pitches $d_1$ are formed on the fourth interlayer insulating layer 70, as shown in FIG. 3B.

Figure 5:
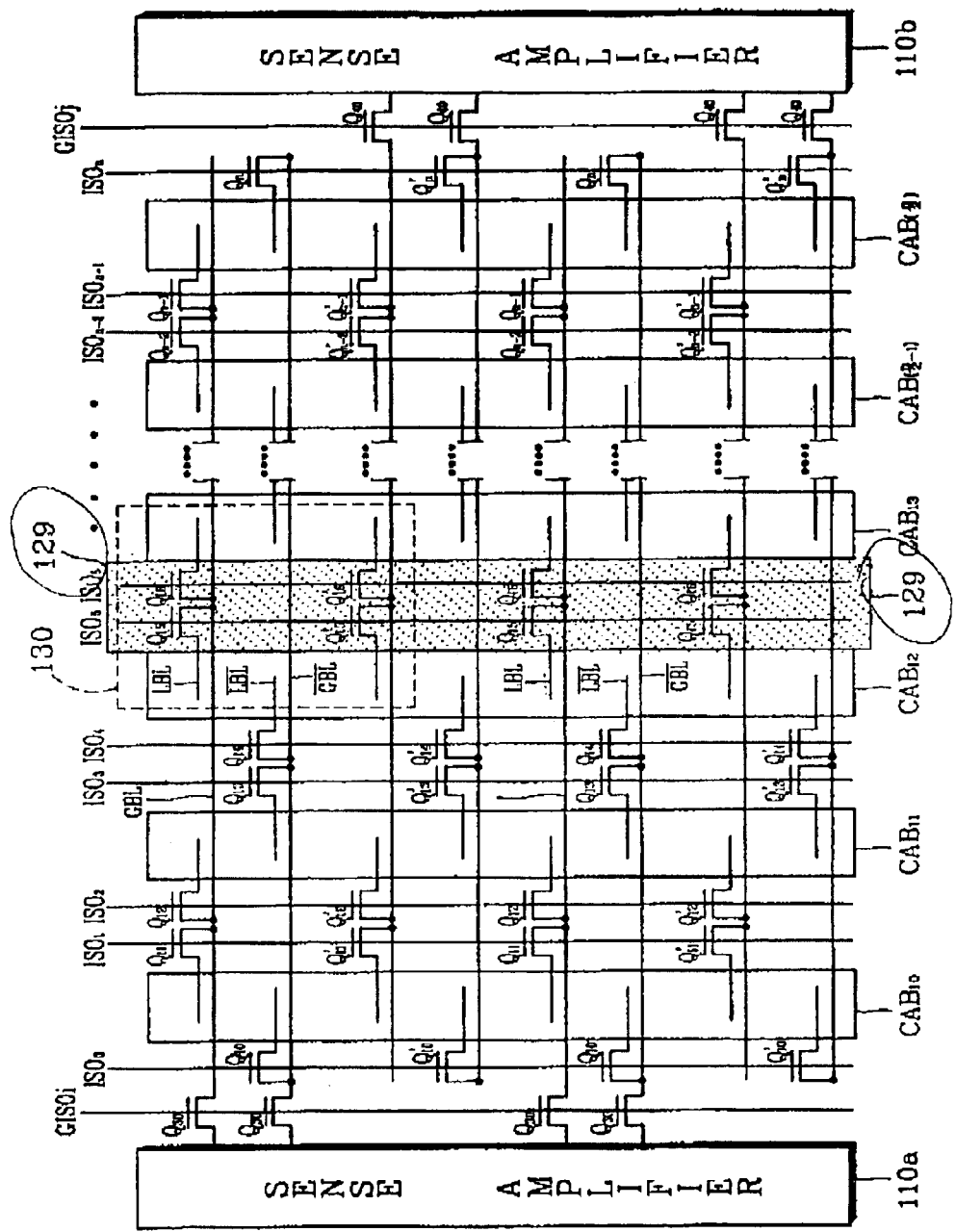
FIG. 5 is a schematic circuit diagram of a semiconductor memory device having bit lines of a hierarchical structure according to a second embodiment of the present invention.

FIG. 5 is a schematic circuit diagram showing the transmission of data from cell array blocks $CAB_{10}$, $CAB_{11}$, ..., $CAB_{(n/2-1)}$, and $CAB_{(n/2)}$ to sense amplifiers 110a and 110b via array select transistors $Q_{10}$, $Q_{10}'$, $Q_{11}$, $Q_{12}$, $Q_{11}'$, $Q_{12}'$, ..., $Q_{n-2}$, $Q_{n-1}$, $Q_{n-2}'$, $Q_{n-1}'$, $Q_n$, and $Q_n \delta N$ in a semiconductor memory device having bit lines of a hierarchical structure. Referring to FIG. 5, an isolation area 129 includes pairs of array select transistors $Q_{11}$ and $Q_{12}$, $Q_{11}'$ and $Q_{12}'$, ..., $Q_{n-2}$ and $Q_{n-1}$, and $Q_{n-2}'$ and $Q_{n-1}'$ having source areas that are commonly connected except for connection control transistors $Q_{10}$, $Q_{10}'$, $Q_n$ and $Q_n'$ adjacent to the sense amplifiers 110a and 110b. The structures of other parts are the same as those of the schematic circuit diagram shown in FIG. 2.

Figure 6:
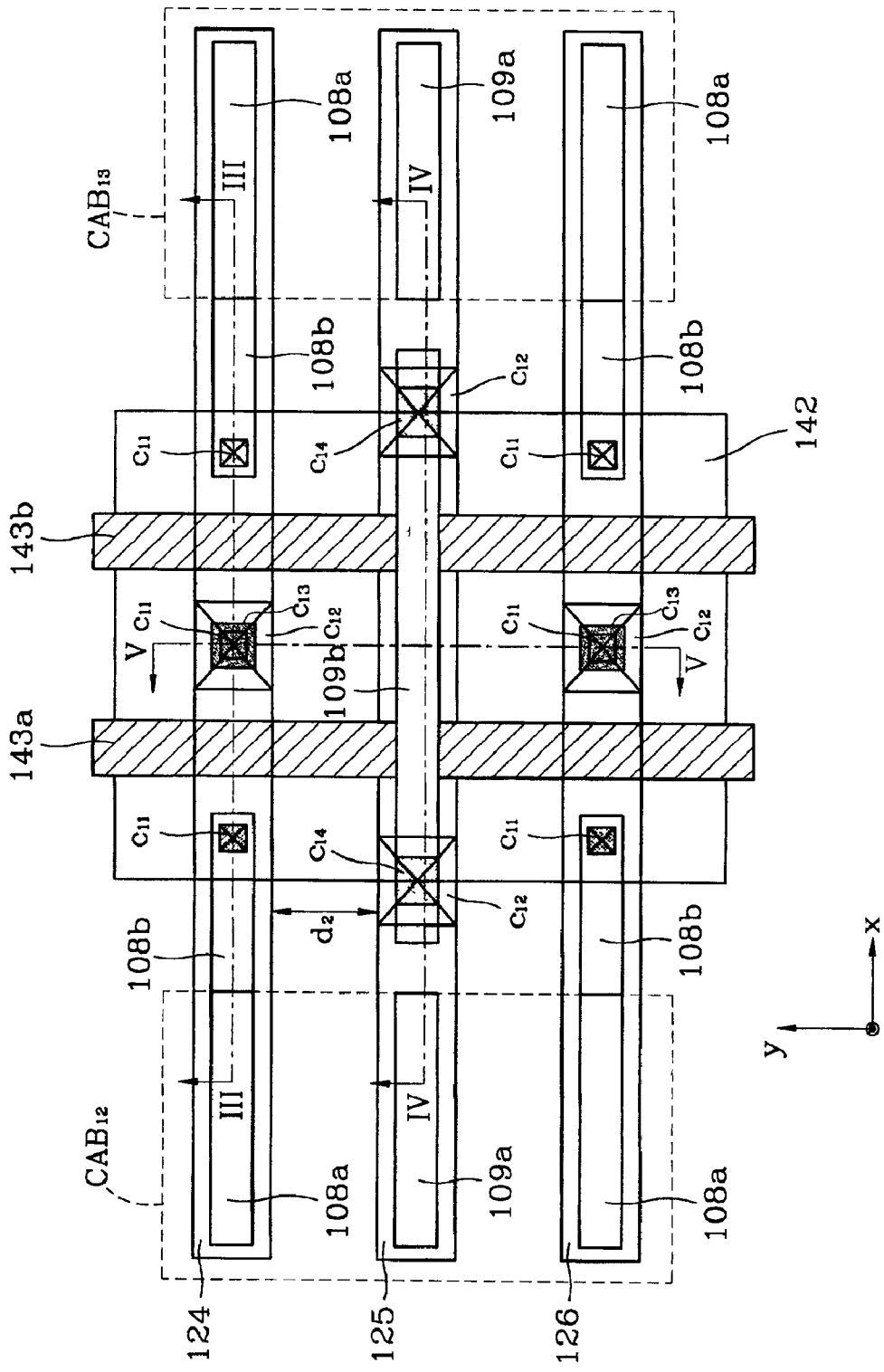
FIG. 6 is a layout of the semiconductor memory device shown in FIG. 5.
Figure 7A:
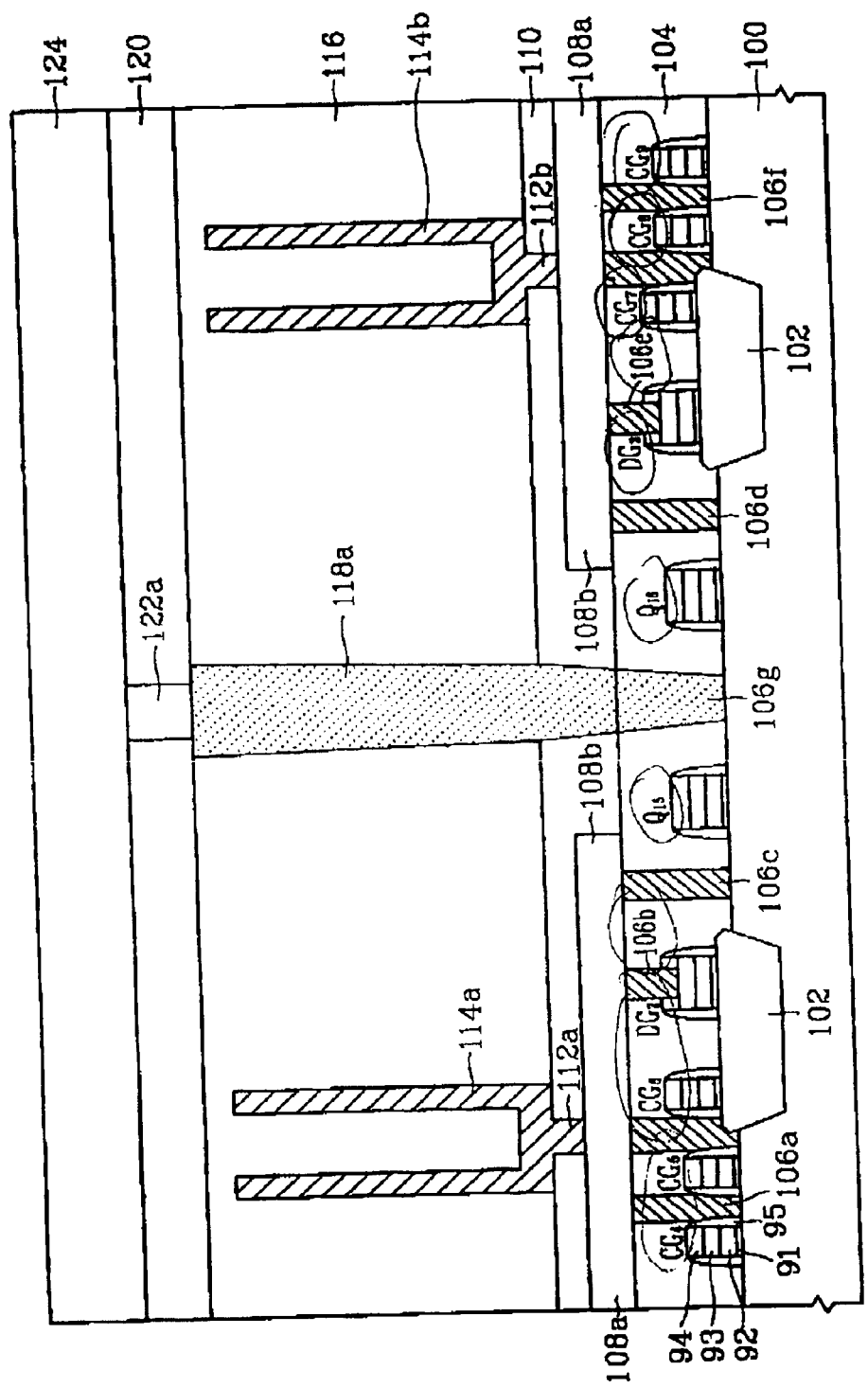
FIG. 7A is a cross section taken along line III—III of the semiconductor memory device shown in FIG. 6.
Figure 7B:
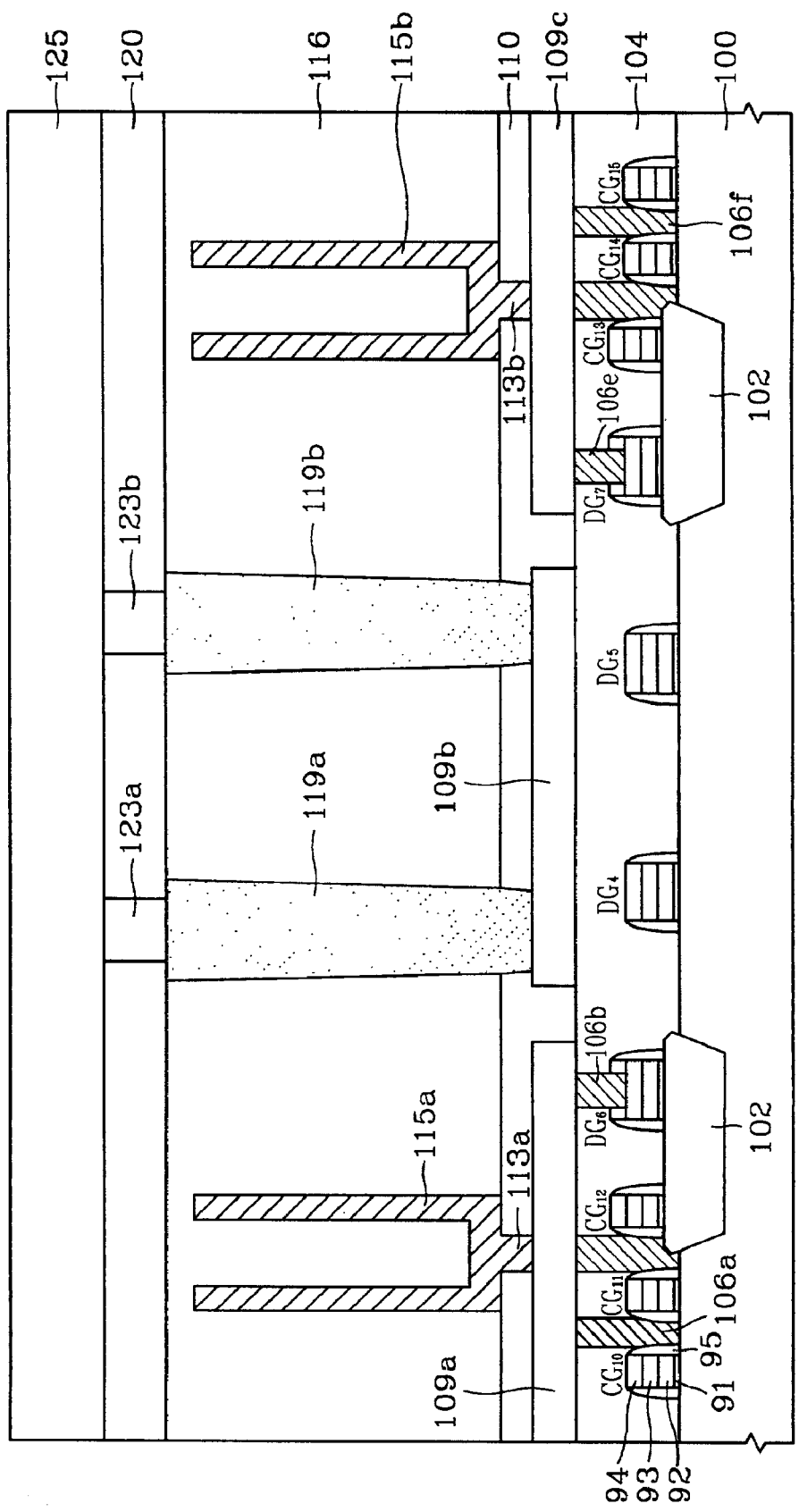
FIG. 7B is a cross section taken along line IV—IV of the semiconductor memory device shown in FIG. 6.
Figure 7C:
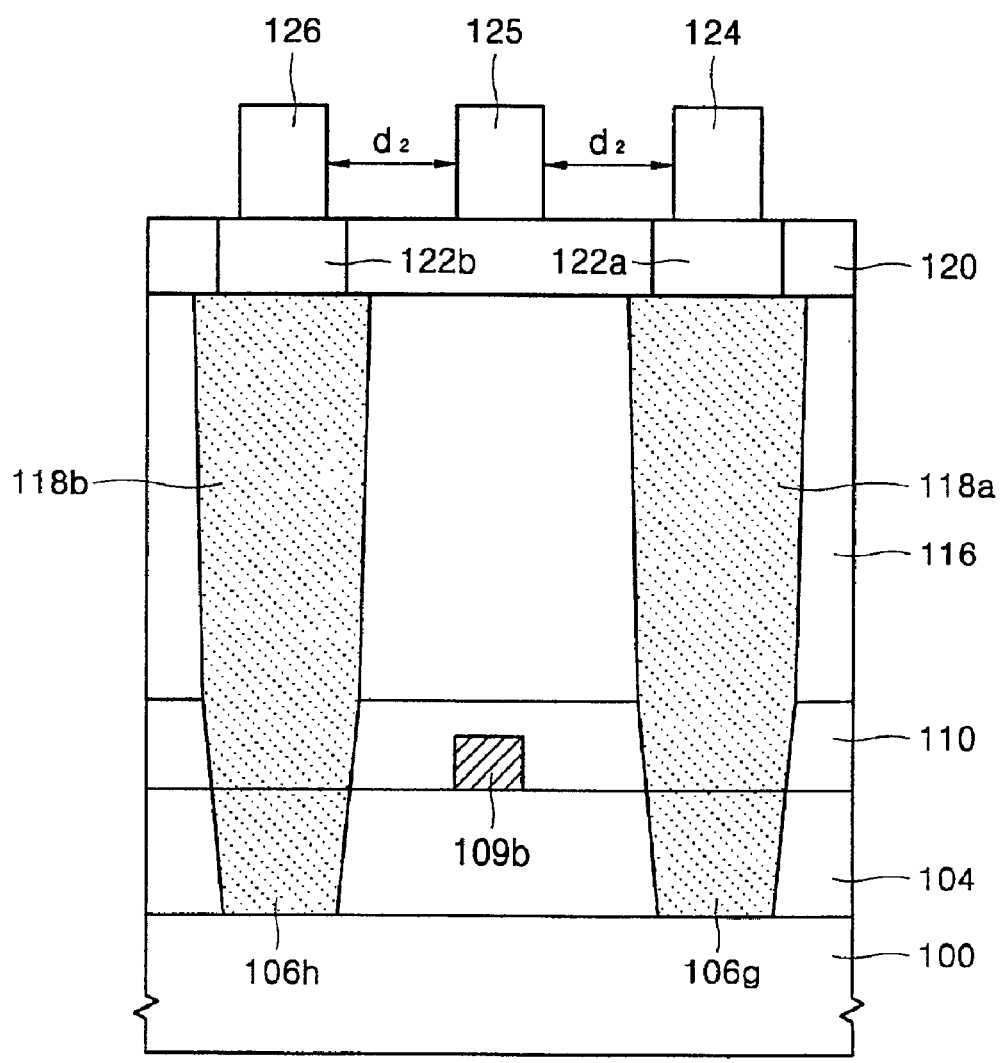
FIG. 7C is a cross section taken along line V—V of the semiconductor memory device shown in FIG. 6.

FIG. 6 shows a diagram of the layout of the isolation area 129 shown in FIG. 5, and FIGS. 7A through 7C show cross sections taken along lines III—III, IV—IV, and V—V, respectively, of FIG. 6. Local bit lines 108a and 109a which extend in the x-direction are disposed in cell array blocks $CAB_{12}$ and $CAB_{13}$. Interlayer insulating layers 110, 116, and 120, shown in FIGS. 7A through 7C, are disposed between the local bit lines 108a and 109a and global bit lines 124, 125, and 126 that extend in the x-direction.

An active area 142 and gate electrodes 143a and 143b for forming select control transistors $Q_{15}$ and $Q_{16}$ included in the isolation area 129 of FIG. 5 are disposed between the cell array blocks CAB12 and CAB13. The gate electrodes 143a and 143b include gate oxide layers 91, polysilicon layers 92, and refractory metal silicide layers 93, as shown in FIGS. 7A and 7B. Silicon nitride layers 94 and spacers 95 on the refractory metal silicide layers 93 are not shown in FIG. 6. The gate electrodes 143a and 143b extend in the y-direction. The local bit line 108a in the first row and the local bit line 108a in the third row are connected to global bit lines 124 and 126, respectively, via plugs 106c and 106d filling contact holes $C_{11}$ and connectors 108b extending from the local bit lines 108a. The active area 142 between the gate electrodes 143a and 143b is connected to the global bit line 124 via plugs 106g and 118a of FIGS. 7A and 7C and the pad 122a, as shown in FIG. 7C. The active area 142 between the gate electrodes 143a and 143b is also connected to the global bit line 126 via plugs 106h and 118b along with the pad 122b, as shown in FIG. 7C. Thus, contact holes $C_{11}$, $C_{12}$, and $C_{13}$, shown in FIG. 7C are filled.

A connection between the local bit line 109a in the second row disposed in the two cell array blocks $CAB_{12}$ and $CAB_{13}$ and the global bit line 125 is not shown in FIGS. 6 and 7A through 7C. A dummy local bit line 109b formed on dummy gate electrodes $DG_4$ and $DG_5$ is connected to the global bit line 125 via dummy plugs 119a and 119b filling contact holes $C_{12}$ and dummy pads 123a and 123b. The spacing between the global bit line 124 disposed in the active area 142 of the isolation area 120 and the adjacent global bit line 125 is $d_2$. Local bit line connectors 108b are disposed in the first and third rows in the isolation area, 129 and the pitch of the local bit line connector 108b is twice the pitch of the global bit line. Thus, in this case, the margin of a process for forming the contact holes $C_{12}$ and $C_{13}$ is increased compare to the case where the pitch of the local bit line connectors 108b is equal to the pitch of the global bit lines 124, 125, and 126.

With reference to FIGS. 7A through 7C, isolation layers 102 for isolating the cell array block $CAB_{12}$ and the cell array block $CAB_{13}$ from the isolation area 129 are formed on a semiconductor substrate 100. The cell array blocks $CAB_{12}$ and $CAB_{13}$ include gate electrode structures $CG_4$, $CG_5$, $CG_6$, $CG_7$, $CG_8$, $CG_9$, $CG_{10}$, $CG_{11}$, $CG_{12}$, $CG_{13}$, $CG_{14}$, and $CG_{15}$ of cell transistors, each having gate oxide layers 91, polysilicon layers 92, refractory metal silicide layers 93, silicon nitride layers 94, and nitride spacers 95. Dummy gate electrode structures $DG_2$, $DG_3$, $DG_4$, $DG_5$, $DG_6$, and $DG_7$ are formed on the isolation layers 102, and connection control transistors $Q_{15}$ and $Q_{16}$ are formed in the isolation area 129 of FIG. 6. Local bit lines 108a are formed on first interlayer insulating layers 104 in the cell array areas, and connectors 108b are formed as extensions of the local bit lines 108a. The local bit lines 108a are connected to the semiconductor substrate 100, more particularly, to the active areas 142 of the cell transistors via plugs 106a and 106f. The local bit line connectors 108b for connecting the local bit lines 108a to the connection control transistors $Q_{15}$ and $Q_{16}$ are connected in common to source areas of the connection control transistors $Q_{15}$ and $Q_{16}$ via plugs 106c and 106d. The connectors 108b are also connected to the dummy gate electrode structures $DG_2$ and $DG_3$. Capacitors 114a, 114b, 115a, and 115b are formed in the cell array areas on second interlayer insulating layers 110 which cover the local bit lines 108a, 109a, and 109c. The capacitors 114a, 114b, 115a, and 115b are connected to cell transistors via plugs 112a, 112b, 113a, and 113b formed in the first and second interlayer insulating layers 104 and 110. A third interlayer insulating layer 116 covers the capacitors 114a, 114b, 115a, and 115b. Global bit lines 124, 125, and 126 are formed a fourth interlayer insulating layer 120 overlying the third interlayer insulating layer 116.

The global bit line 124 is connected to drain areas of the connection control transistors $Q_{15}$ and $Q_{16}$ via pads 122a and 122b formed in the fourth interlayer insulating layer 120 and plugs 106f and 118b, 106g and 118a included in the first, second, and third interlayer insulating layers 104, 110, and 116.

As described in FIGS. 2, 3A, and 3B, the height of the second and third interlayer insulating layers 110 and 116 having the capacitors 114a and 114b are increased. Thus, the upper widths of the plugs 118a and 118b are much greater than the upper widths of the plugs 106g and 106h.

Accordingly, in the present invention, the pads 122a and 122b having widths less than the upper widths of the plugs 118a and 118b are formed in the fourth interlayer insulating layer 120, which is formed on the third interlayer insulating layer 116. The global bit lines 124 and 126 are thus connected to the drain area of the connection control transistor $Q_{15}$ via the pads 122a and 122b.

The thickness of the fourth interlayer insulating layer 120 should be less than the sum of the thicknesses of the second and third interlayer insulating layers 110 and 116. However, as described above, the contact holes $C_{11}$, $C_{12}$, and $C_{13}$ for connecting the global bit lines 124 and 126 to the semiconductor substrate are formed in the first and third rows of the isolation area 12 shown in FIG. 6. Thus, although the contact hole $C_{12}$ formed in the second and third interlayer insulating layers 110 and 116 is larger than that in the first embodiment, it remains un-connected to the adjacent contact hole $C_{12}$ in the third row formed on the third interlayer insulating layer 110. In other words, the objects of the present embodiment can be achieved if the height ratio of the third interlayer insulating layer to the fourth interlayer insulating layer 120 is increased compared with that of the first embodiment. As a result, the heights of the capacitors 114a and 114b formed in the third interlayer insulating layer 116 can be increased more. Thus, the semiconductor memory device shown in FIGS. 7A through 7C may be more appropriate for the current trend toward integration density than the semiconductor memory device shown in FIGS. 3A and 3B.

Figure 8A:
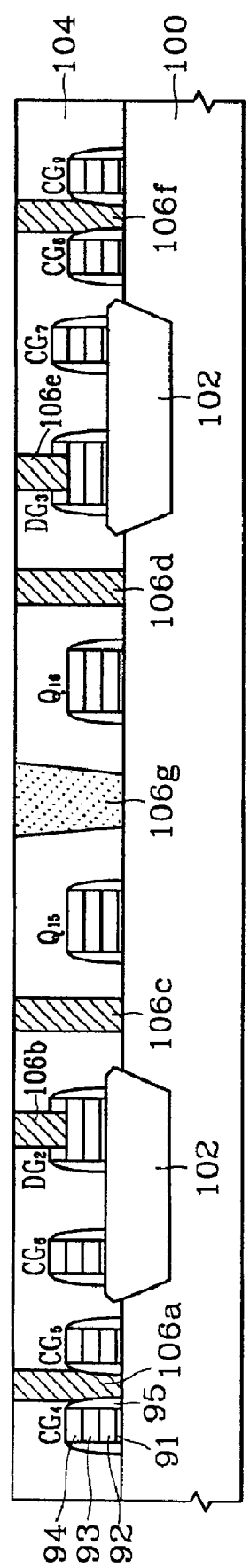
FIGS. 8A through 8C are cross sections describing steps of manufacturing the semiconductor memory device shown in FIG. 7B.
Figure 8B:
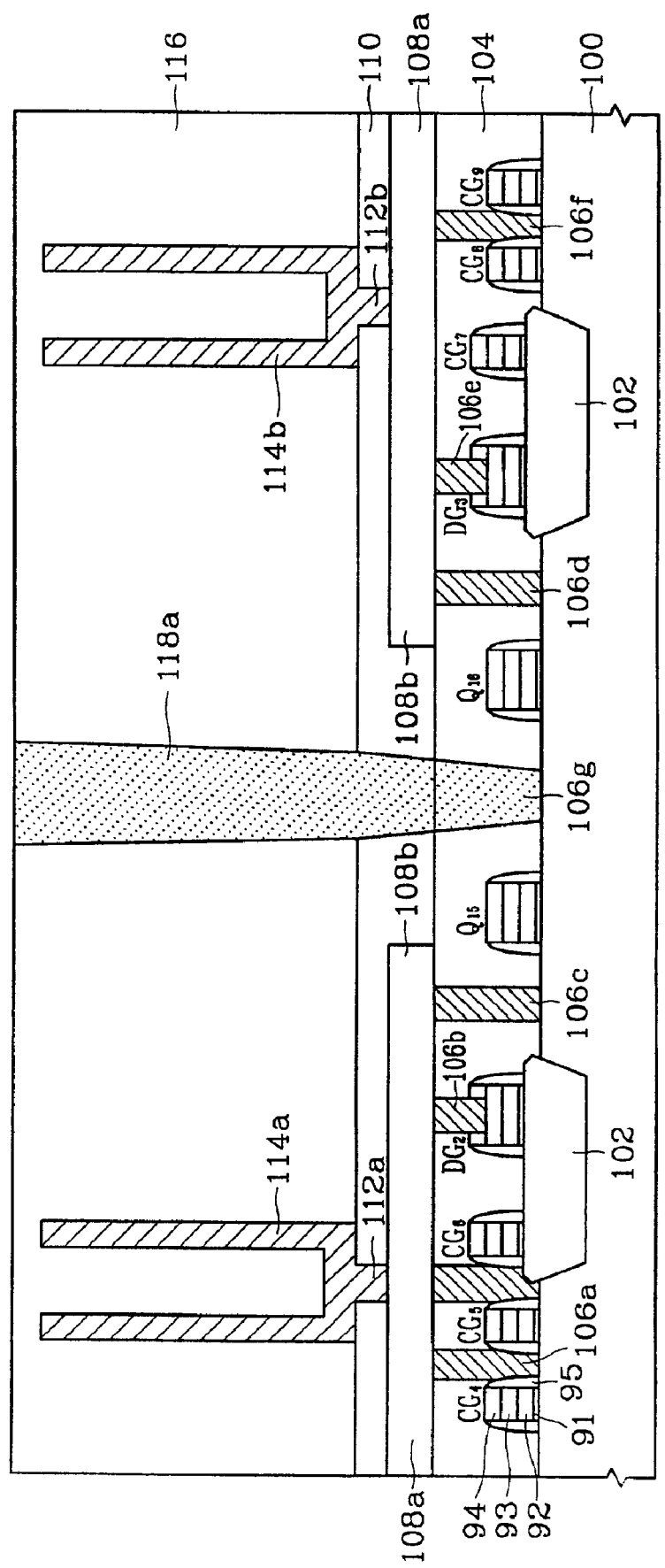
Figure 8C:
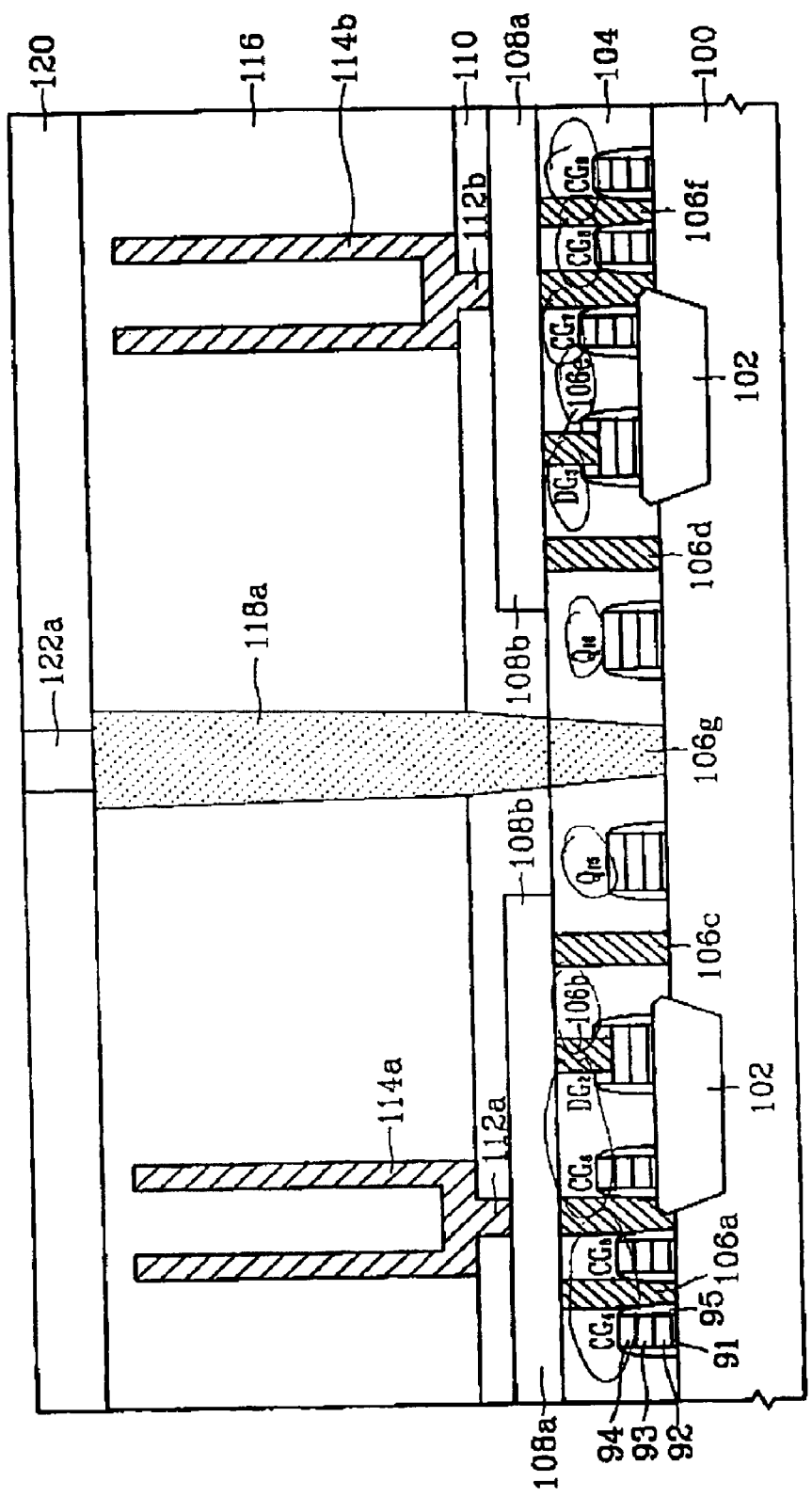

The steps of manufacturing the semiconductor memory device shown in FIG. 7B are described with reference to FIGS. 8A through 8C. A pair of connection control transistors Q15 and Q16 connected in series to each other are formed when cell transistors are formed. The description of other steps is the same as that in FIGS. 4A through 4C and will be omitted.

The present invention has been described in the preferred embodiments with global bit lines that are not twisted. However, it will be apparent to one of ordinary skill in the art that the present invention may be applied to a semiconductor memory device having twisted global bit lines.

In the present invention, interlayer insulating layers are formed between lower conductive layers, e.g., local bit lines, and upper conductive layers, e.g., global bit lines. Plugs and pads having widths less than widths of the plugs are sequentially formed in the interlayer insulating layers. The lower and upper conductive layers can be connected to each other via the plugs and the pads. Thus, a short circuit between an upper conductive layer and an adjacent upper conductive layer can be prevented without increasing the pitches of the upper conductive layers.

What is claimed is:

1. A semiconductor memory device comprising:
   a semiconductor substrate;
   a first interlayer insulating layer;
   a plurality of local bit lines spaced apart from each other and disposed on the first interlayer insulating layer;
   a second interlayer insulating layer on the plurality of local bit lines;
   a capacitor formed on the second interlayer insulating layer and electrically connected to the semiconductor substrate;
   a plurality of global bit lines which are spaced apart from each other and are disposed on the second interlayer insulating layer; and
   a plurality of connecting devices formed in the first and second interlayer insulating layers, and each connecting device electrically connecting the plurality of local bit lines and the plurality of global bit lines,
   wherein each connecting device has a pad directly connected to one of global bit lines, first plugs connecting the semiconductor substrate to one of the local bit lines, a connector extending from one of the local bit lines and electrically connecting one of the local bit lines to the first plugs, and second plugs formed in the first and second interlayer insulating layers, connected to the pad, and connected to the first plugs via the semiconductor substrate, wherein the second plugs are wider toward the upper portion of the second interlayer insulating layer, the upper portion of the second plugs is not connected to the upper portion of adjacent second plugs, the lower width of the pad is less than the upper width of the second plugs, and the pad has an upper width such that one of the global bit lines connected to the pad is not electrically connected to an adjacent global bit line via the pad, wherein the pad having an upper width is directly formed on the second plug.

2. The semiconductor memory device of claim 1, wherein the pitch of the global bit lines is equal to the pitch of the connector.

3. The semiconductor memory device of claim 2, wherein the height of the second plug is 2–4 times the height of the pad.

4. The semiconductor memory device of claim 1, wherein the pitch of the connector is twice the pitch of the global bit lines.

5. The semiconductor memory device of claim 4, wherein the height of the second plugs is four times the height of the pad.

6. The semiconductor memory device of claim 1, wherein the height of the first plugs is equal to or less than the height of the pad.

7. The semiconductor memory device of claim 1, wherein the connecting devices further comprise a circuit device which is formed on the semiconductor substrate and controls the electrical connection between the first and second plugs.

8. The semiconductor memory device of claim 7, wherein the circuit device is an NMOS transistor, and the first and second plugs are each connected to source and drain areas of the NMOS transistor.

9. The semiconductor memory device of claim 1, wherein the upper surface of the second plugs is positioned higher than the upper surface of the capacitor.

* * * * *

UNITED STATES PATENT AND TRADEMARK OFFICE
CERTIFICATE OF CORRECTION

PATENT NO. : 6,900,546 B2 Page 1 of 1
APPLICATION NO. : 10/091102
DATED : May 31, 2005
INVENTOR(S) : Yang et al.

It is certified that error appears in the above-identified patent and that said Letters Patent is hereby corrected as shown below:

Column 5, line 23, please replace "$N_n; N_n'$." with --$N_n, N_n'$.--
Column 8, line 58, please replace "$Q_n\delta N$" with --$Q_n\square N$--
Column 8, line 60, please replace "area 129" with --area 120--
Column 9, line 2, please replace "area 129" with --area 120--
Column 9, line 12, please replace "area 129" with --area 120--
Column 9, line 41, please replace "area 129" with --area 120--
Column 9, line 50, please replace "area 129" with --area 120--
Column 9, line 60, please replace "area 129" with --area 120--
Column 12, line 23, please replace "equal to or less than" with --equal to or greater than--

Signed and Sealed this

Second Day of January, 2007

JON W. DUDAS
*Director of the United States Patent and Trademark Office*